United States Patent
Alok et al.

[11] Patent Number: 6,011,278
[45] Date of Patent: Jan. 4, 2000

[54] LATERAL SILICON CARBIDE SEMICONDUCTOR DEVICE HAVING A DRIFT REGION WITH A VARYING DOPING LEVEL

[75] Inventors: Dev Alok, Dansbury, Conn.; Satyendranath Mukherjee, Yorktown Heights; Emil Arnold, Chappagua, both of N.Y.

[73] Assignee: Philips Electronics North America Corporation, New York, N.Y.

[21] Appl. No.: 08/959,346

[22] Filed: Oct. 28, 1997

[51] Int. Cl.[7] .................. H01L 31/0256; H01L 31/0312; H01L 23/58
[52] U.S. Cl. ................................ 257/76; 257/77; 257/493
[58] Field of Search ........................ 257/77, 493

[56] References Cited

U.S. PATENT DOCUMENTS

| | | | |
|---|---|---|---|
| 5,300,448 | 4/1994 | Merchant et al. | 438/163 |
| 5,374,843 | 12/1994 | Williams et al. | 257/493 |
| 5,506,421 | 4/1996 | Palmour | 257/77 |

OTHER PUBLICATIONS

Electronics Letters, vol. 32, No. 20, pp. 1929–1931, 1996.

*Primary Examiner*—Tom Thomas
*Assistant Examiner*—Cuong Q. Nguyen
*Attorney, Agent, or Firm*—Steven R. Biren

[57] ABSTRACT

A lateral silicon carbide (SiC) semiconductor device includes a SIC substrate of a first conductivity type, a SiC epitaxial layer of the first conductivity type on the substrate and a SiC surface layer on the SiC epitaxial layer. The SiC surface layer has a SiC first region of the first conductivity type, a SiC lateral drift region of a second conductivity type opposite to that of the first conductivity type adjacent the first region and forming a p-n junction therewith, and a SiC second region of the second conductivity type spaced apart from the first region by the drift region. By providing the drift region with a variable doping level which increases in a direction from the first region to the second region, compact SiC semiconductor devices such as high-voltage diodes or MOSFETs can be formed which can operate at high voltages, high temperatures and high frequencies, thus providing a substantial advantage over known devices.

5 Claims, 1 Drawing Sheet

LATERAL SILICON CARBIDE SEMICONDUCTOR DEVICE HAVING A DRIFT REGION WITH A VARYING DOPING LEVEL

BACKGROUND OF THE INVENTION

The invention is in the field of high-voltage lateral semiconductor devices, and relates more particularly to lateral silicon carbide (SiC) semiconductor devices suitable for high-voltage applications.

In various applications, such as traction control systems in locomotives and the electrical systems in electric vehicles, semiconductor devices which can support high voltages, typically up to 5,000 Volts, are desirable. Additionally, such devices should be able to operate at high temperatures and at relatively high frequencies, typically above 150 kHz. Although certain silicon devices, such as thyristors, which can support 5,000 Volts presently exist, these devices are not able to operate at high temperatures and frequencies due to the inherent limitations of silicon as a semiconductor material.

In order to overcome the drawbacks of silicon, it has been proposed to use silicon carbide in fabricating high-voltage, high-frequency, high-temperature semiconductor devices. Under such operating conditions, unipolar devices are superior to bipolar devices, and lateral unipolar devices are superior to vertical unipolar devices because lateral devices can provide a smaller "on" resistance and therefore lower losses than comparable vertical devices.

The use of silicon carbide in a high-voltage lateral unipolar device is shown in "High voltage (450 v) 6H-SiC lateral MESFET structure", D. Alok et al, Electronics Letters, Vol. 32, No. 20, pp. 1929–1931, 1996. This reference describes a lateral MESFET SiC structure capable of withstanding a forward blocking voltage of 450 Volts, a level which is about 2–3 times higher than previously reported for lateral SiC MESFET devices.

While this earlier work of a present co-inventor represents a substantial advance in the art, it would nevertheless be desirable to have a lateral unipolar device capable of operating at substantially higher voltages while providing good high-temperature and high-frequency performance in a relatively compact structure.

SUMMARY OF THE INVENTION

It is therefore an object of the invention to provide a compact high-voltage unipolar semiconductor device capable of supporting at least several thousand Volts. It is a further object of the invention to provide such a high-voltage semiconductor device which is capable of operating at relatively high temperatures and high frequencies.

In accordance with the invention, these objects are achieved in a lateral unipolar semiconductor device in which silicon carbide is used as the semiconductor material, and in which the drift region of the device has a varying doping level in the lateral direction. Typically, the semiconductor device may be a lateral MOSFET device in which the doping level increases from the source region to the drain region of the device.

In a preferred embodiment of the invention, the varying doping level may increase either linearly initially and then as a function of the square-root of the distance from the anode (in a diode) or source (FET), in a stepwise fashion, or linearly.

In a further preferred embodiment of the invention, the varying doping level is selected to provide a uniform potential distribution in the drift region of the device.

Lateral unipolar devices in accordance with the present invention, in which the device structure is fabricated of silicon carbide semiconductor material and the drift region has a varying doping level, offer a significant improvement in that high-voltage, high-temperature and high-frequency operation can be achieved in a compact structure to an extent not possible with prior-art devices.

These and other aspects of the invention will be apparent from and elucidated with reference to the embodiments described hereinafter.

BRIEF DESCRIPTION OF THE DRAWING

The invention may be more completely understood with reference to the following description, to be read in conjunction with the accompanying drawing, in which.

Figure 1:
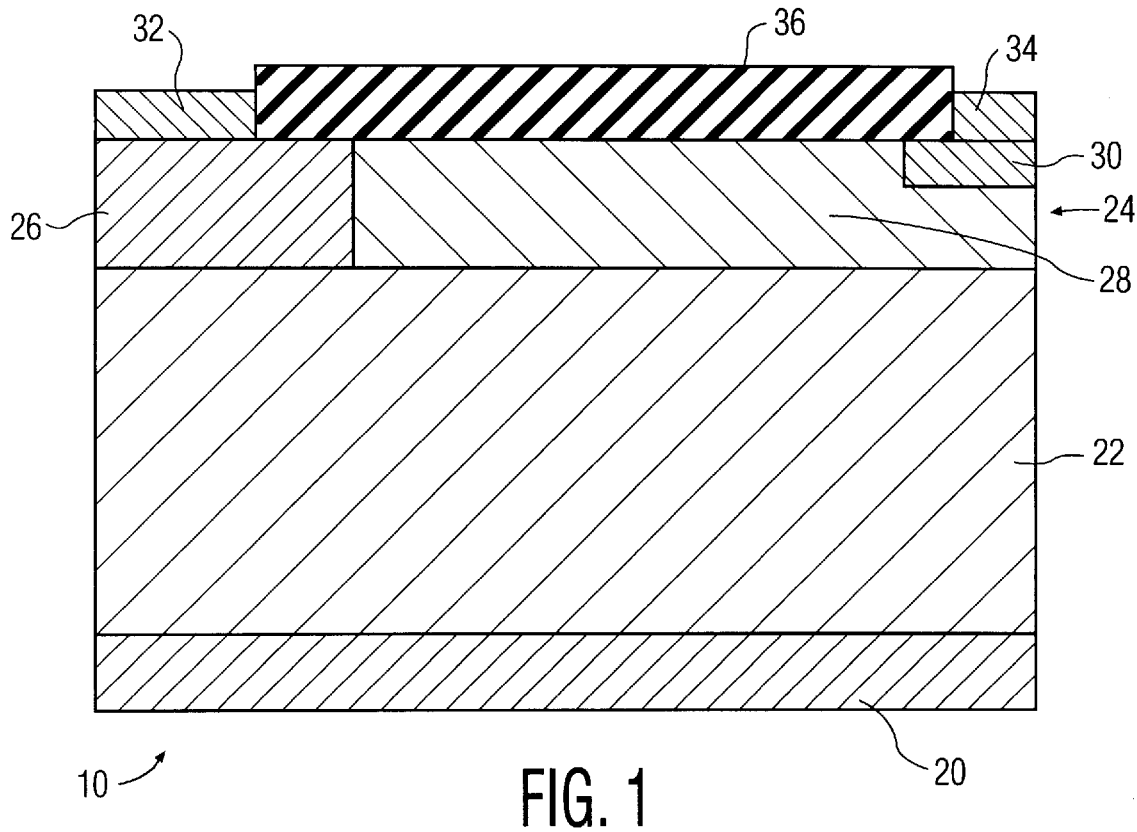
FIG. 1 shows a cross-sectional view of an SiC diode device in accordance with a first embodiment of the invention.

In the drawing, semiconductor regions having the same conductivity type are generally shown hatched in the same direction, and it should be noted that the figures are not drawn to scale.

DESCRIPTION OF THE PREFERRED EMBODIMENTS

A lateral unipolar SiC semiconductor device 10 in accordance with the invention is shown in simplified form for purposes of illustration in FIG. 1. The device shown in FIG. 1 is a lateral high-voltage diode structure, for simplicity in illustrating the invention, but it will be understood that other devices, such as MOSFETs, MESFETs or JFETs may also advantageously use the principles of the invention.

The diode shown in FIG. 1 includes a semiconductor substrate 20, here a p-type substrate having a typical thickness of 250–300 microns and a doping level of about $3e18cm^{-3}$, although it will be recognized that these values are not critical and are given for illustrative purposes only. In accordance with the invention, the substrate, as well as all subsequently-described semiconductor layers and regions, are formed of a silicon carbide semiconductor material, such as 4H-SiC. An epitaxial layer 22, here of p-type silicon carbide and having a thickness of about 55 microns and a doping level of about $1.8e15cm^{-3}$ is provided on the substrate, and a silicon carbide surface layer 24, here having a thickness of about 10 microns, is provided on the epitaxial layer.

The surface layer 24 includes a p-type region 26 which in this embodiment forms the anode of the lateral diode structure and has a doping level of about $1e18cm^{-3}$ in the this example. Adjacent to region 26 and forming a p-n junction therewith is an n-type SiC region 28 which forms a drift region of the device. In accordance with the invention, this SiC drift region has a varying, rather than constant, doping level which increases in a direction from region 26 toward an n-type region 30, which in this example has a doping level of about $1e20cm^{-3}$ and a typical thickness of 1 micron or less, and forms the cathode region of the diode. The doping level in drift region 28 may increase in several different manners, such as initially in a linear fashion from adjacent region 26 and then as a function of the square-root of the distance from region 26, in a linear fashion, or in a stepwise fashion. Within the basic concept of providing a varying doping level in a SiC drift region, the invention contemplates a substantial range of doping levels and rates of variation. By way of nonlimitative example, the doping level in the drift region may increase by a factor in the range of about 1.5 to 20 times from adjacent the anode region to adjacent the cathode region of the device. In a preferred embodiment of the invention, the doping level may increase from about $6e15cm^{-3}$ in the portion of the drift region adjacent the anode region 26 to about $1e16cm^{-3}$ in the portion adjacent the cathode region 30.

The structure of the lateral diode device shown in FIG. 1 is completed in conventional fashion by providing anode and cathode contacts 32 and 34, respectively, with an insulating region 36 of silicon oxide or the like over the exposed areas of surface layer 24.

An advantage of the structure shown is that high breakdown voltages can be obtained with relatively compact devices. Thus, for the device shown in FIG. 1, a breakdown voltage of about 5,000 Volts can be obtained with a lateral drift region dimension of about 60 microns, while employing drift region height and doping levels as previously described.

Figure 2:
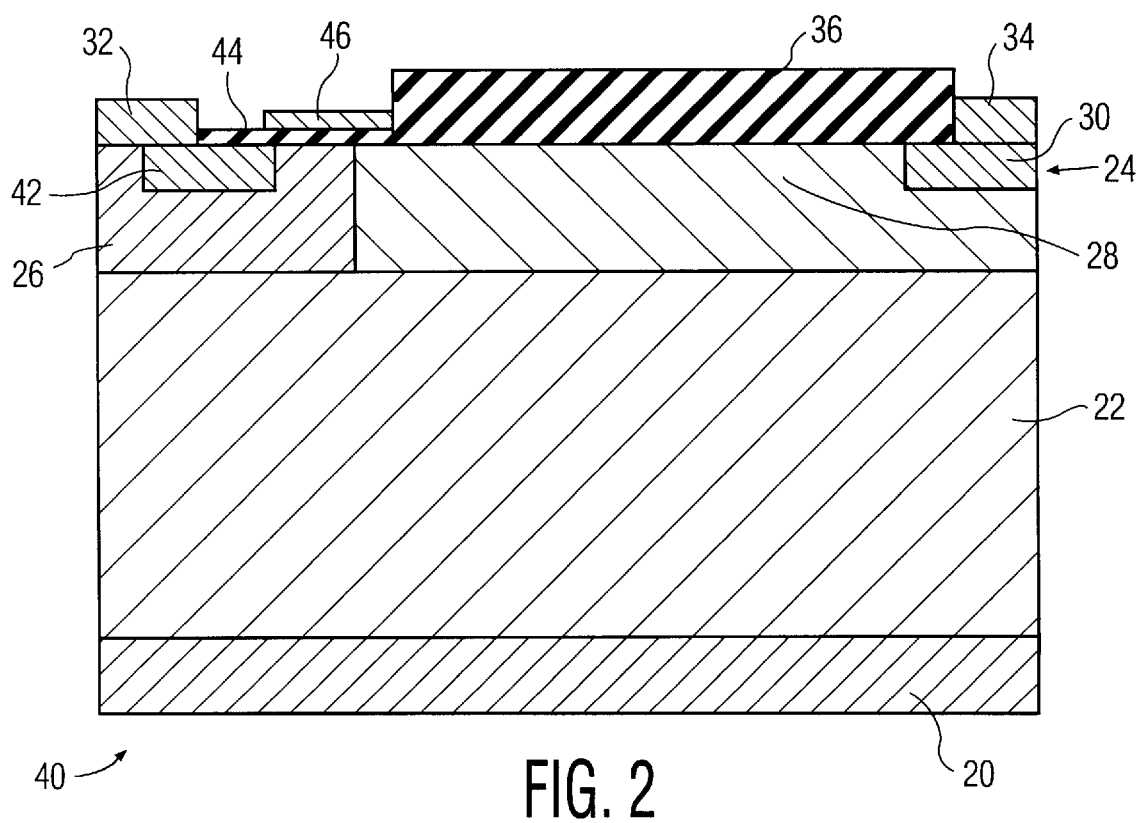
FIG. 2 shows a cross-sectional view of an SiC MOSFET device in accordance with a second embodiment of the invention.

A second embodiment of the invention, in which the invention is incorporated in a SiC MOSFET device 40, is shown in FIG. 2. In FIG. 2, regions which correspond to like regions in FIG. 1 are provided with like reference numerals for identification, and are further described only to the extent that they differ from the previously-described regions. Although the device used to illustrate the application of the invention to a 3-terminal active unipolar device is a MOSFET, it will be recognized that other types of devices, such as MESFETs or JFETs, may also advantageously employ the principles of the present invention to secure the advantages described above.

Structurally, the MOSFET device 40 shown in FIG. 2 differs from the diode device shown in FIG. 1 in that the region 26 now forms the body region of the device, with a surface-adjoining source region 42 formed of n-type material in the body region. A thin gate dielectric region 44, of silicon oxide or other dielectric material, is provided over portions of regions 42 and 26 as shown, and a conductive gate electrode 46 is formed on gate dielectric layer 44 and over at least that portion of base region 26 which forms a channel region of the MOSFET device during operation. The construction and configuration of the gate dielectric and gate electrode are conventional for MOSFET power devices, and are thus not described in further detail. Furthermore, it will be recognized that, in this embodiment, region 30 forms the drain region, with its associated contact 34, while region 42 forms the source region, with its associated contact 32.

In the illustrative embodiment shown in FIG. 2, the thickness of epitaxial layer 22 is about 55 microns in a transistor having a breakdown voltage of about 5,000 Volts, and the lateral extent of the drift region 28, between the base region 26 and the drain region 30, is about 60 microns. The source and drain regions 42 and 30, respectively, may have a depth of about 0.1 microns with a doping concentration of about $1e19cm^{-3}$. The gate electrode 46 may be polysilicon, with the thickness of the underlying gate dielectric being about 0.1 micron. The remaining layer thicknesses and doping levels for the device shown in FIG. 2 are substantially the same as those shown for the device in FIG. 1, again with the understanding that these parameters are for purposes of illustration only. In particular, it is noted that the doping level of the SiC drift region 28 may, in the illustrative embodiment shown in FIG. 2, varying in the same manner and to the same degree as previously described with respect to the diode embodiment of FIG. 1.

In this manner, the present invention provides unipolar devices capable of blocking high voltages while operating at relatively high frequencies and temperatures, in a relatively compact device configuration.

While the invention has been particularly shown and described with reference to several preferred embodiments thereof, it will be understood by those skilled in the art that various changes in form and detail may be made without departing from the spirit or scope of the invention.

What is claimed is:

1. A lateral unipolar silicon carbide (SiC) semiconductor device comprising a SiC substrate of a first conductivity type, a SiC epitaxial layer of said first conductivity type on said SiC substrate, and a SiC surface layer on said SiC epitaxial layer and having a SiC first region of said first conductivity type, a Sic lateral drift region of a second conductivity type opposite to that of the first conductivity type adjacent said first region and forming a p-n junction therewith, and a SiC second region of said second conductivity type spaced apart from said first region by said drift region, characterized in that said drift region has a varying doping level which increases in a lateral direction from said first region to said second region, and wherein said varying doping level increases in said direction from said first region to said second region initially in a linear fashion and then as a function of the square-root of the distance from said first region.

2. A lateral unipolar silicon carbide (SiC) semiconductor device as in claim 1, wherein said varying doping level in said drift region increases by a factor of about 1.5 to 20 times from adjacent said first region to adjacent said second region.

3. A lateral unipolar silicon carbide (SiC) semiconductor device as in claim 1, wherein said device comprises a diode, and said first and second regions comprise an anode and a cathode of said diode.

4. A lateral unipolar silicon carbide (SiC) semiconductor device as in claim 1, wherein said device comprises a MOSFET having a surface-adjoining SiC source region of said second conductivity type in said first region, and an insulated gate electrode over at least that portion of said first region which forms a channel region of the MOSFET, said second region comprising a drain region of the MOSFET.

5. A lateral unipolar silicon carbide (SiC) semiconductor device as in claim 1, wherein the varying doping level of said drift region is selected to provide a uniform potential distribution in said drift region.

\* \* \* \* \*